(12) United States Patent
de Larios et al.

(10) Patent No.: US 7,416,370 B2
(45) Date of Patent: Aug. 26, 2008

(54) METHOD AND APPARATUS FOR TRANSPORTING A SUBSTRATE USING NON-NEWTONIAN FLUID

(75) Inventors: John M. de Larios, Palo Alto, CA (US); Mike Ravkin, Sunnyvale, CA (US); John Parks, Hercules, CA (US); Mikhail Korolik, San Jose, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/154,129

(22) Filed: Jun. 15, 2005

(65) Prior Publication Data

US 2006/0285930 A1    Dec. 21, 2006

(51) Int. Cl.
*B65G 51/16* (2006.01)
(52) U.S. Cl. .................... 406/27; 406/26; 406/146
(58) Field of Classification Search ............. 406/26, 406/27, 112, 136, 141, 142, 146
See application file for complete search history.

(56) References Cited

U.S. PATENT DOCUMENTS

| | | | |
|---|---|---|---|
| 3,037,887 A | 6/1962 | Brenner et al. | 134/22 |
| 3,212,762 A | 10/1965 | Carroll et al. | 261/124 |
| 3,436,262 A | 4/1969 | Crowe et al. | 134/10 |
| 3,617,095 A | 11/1971 | Lissant | |
| 3,978,176 A | 8/1976 | Voegeli | 261/122 |
| 4,085,059 A | 4/1978 | Smith et al. | 134/26 |
| 4,133,773 A | 1/1979 | Simmons | 261/21 |
| 4,156,619 A | 5/1979 | Griesshammer | 134/2 |
| 4,236,851 A * | 12/1980 | Szasz | 406/72 |
| 4,238,244 A | 12/1980 | Banks | 134/22 |
| 4,781,764 A | 11/1988 | Leenaars | 134/34 |
| 4,817,652 A | 4/1989 | Liu et al. | 134/102 |
| 4,838,289 A | 6/1989 | Kottman et al. | 134/153 |
| 4,849,027 A | 7/1989 | Simmons | 134/22 |
| 4,871,284 A * | 10/1989 | Duffy | 406/49 |
| 4,911,761 A | 3/1990 | McConnell et al. | 134/11 |
| 4,962,776 A | 10/1990 | Liu et al. | 134/11 |

(Continued)

FOREIGN PATENT DOCUMENTS

DE    40 38 587 A1    6/1992

(Continued)

OTHER PUBLICATIONS

Aubert, JM et al.; "Aqueous foams"; Scientific America; 1986, 74-82, 254.

(Continued)

*Primary Examiner*—Douglas A Hess
(74) *Attorney, Agent, or Firm*—Martine Penilla & Gencarella LLP

(57) ABSTRACT

A method for transporting a substrate is provided. In this method, a non-Newtonian fluid is provided and the substrate is suspended in the non-Newtonian fluid. The non-Newtonian fluid is capable of supporting the substrate. Thereafter, a supply force is applied on the non-Newtonian fluid to cause the non-Newtonian fluid to flow, whereby the flow is capable of moving the substrate along a direction of the flow. Apparatuses and systems for transporting the substrate using the non-Newtonian fluid also are described.

10 Claims, 7 Drawing Sheets

U.S. PATENT DOCUMENTS

| | | | |
|---|---|---|---|
| 5,000,795 A | 3/1991 | Chung et al. | 134/37 |
| 5,048,549 A | 9/1991 | Hethcoat | 134/122 R |
| 5,068,040 A * | 11/1991 | Jackson | 210/748 |
| 5,102,777 A | 4/1992 | Lin et al. | 430/331 |
| 5,105,556 A | 4/1992 | Kurokawa et al. | 34/12 |
| 5,113,597 A | 5/1992 | Sylla | 34/22 |
| 5,175,124 A | 12/1992 | Winebarger | 437/180 |
| 5,181,985 A | 1/1993 | Lampert et al. | 156/635 |
| 5,226,969 A | 7/1993 | Watanabe et al. | 134/7 |
| 5,242,669 A | 9/1993 | Flor | 423/465 |
| 5,271,774 A | 12/1993 | Leenaars et al. | 134/31 |
| 5,288,332 A | 2/1994 | Pustilnik et al. | 134/27 |
| 5,306,350 A | 4/1994 | Hoy et al. | 134/22.14 |
| 5,336,371 A | 8/1994 | Chung et al. | 156/659.1 |
| 5,415,191 A | 5/1995 | Mashimo et al. | 134/102.1 |
| 5,417,768 A | 5/1995 | Smith et al. | 134/10 |
| 5,464,480 A | 11/1995 | Matthews | 134/1.3 |
| 5,472,502 A | 12/1995 | Batchelder | 118/52 |
| 5,488,521 A * | 1/1996 | Lemke et al. | 360/97.02 |
| 5,494,526 A | 2/1996 | Paranjpe | 134/1 |
| 5,498,293 A | 3/1996 | Ilardi et al. | 134/3 |
| 5,549,753 A * | 8/1996 | Matthews et al. | 118/316 |
| 5,656,097 A | 8/1997 | Olesen et al. | 134/1 |
| 5,660,642 A | 8/1997 | Britten | 134/30 |
| 5,705,223 A | 1/1998 | Bunkofske | 427/240 |
| 5,800,626 A | 9/1998 | Cohen et al. | 134/1.3 |
| 5,858,283 A | 1/1999 | Burris | 261/122.1 |
| 5,900,191 A | 5/1999 | Gray et al. | 261/59 |
| 5,904,156 A | 5/1999 | Advocate, Jr. et al. | 134/2 |
| 5,908,509 A | 6/1999 | Olesen et al. | 134/1.3 |
| 5,911,837 A | 6/1999 | Matthews | 134/2 |
| 5,932,493 A | 8/1999 | Akatsu et al. | 438/745 |
| 5,944,581 A | 8/1999 | Goenka | 431/39 |
| 5,944,582 A | 8/1999 | Talieh | 451/41 |
| 5,945,351 A | 8/1999 | Mathuni | 438/706 |
| 5,951,779 A | 9/1999 | Koyanagi et al. | 134/2 |
| 5,964,954 A | 10/1999 | Matsukawa et al. | 134/6 |
| 5,964,958 A | 10/1999 | Ferrell et al. | 134/26 |
| 5,968,285 A | 10/1999 | Ferrell et al. | 134/26 |
| 5,997,653 A | 12/1999 | Yamasaka | 134/2 |
| 6,048,409 A | 4/2000 | Kanno et al. | 134/34 |
| 6,049,996 A | 4/2000 | Freeman et al. | 34/362 |
| 6,081,650 A | 6/2000 | Lyons et al. | 386/95 |
| 6,090,217 A | 7/2000 | Kittle | 134/11 |
| 6,092,538 A | 7/2000 | Arai et al. | 134/1.3 |
| 6,152,805 A | 11/2000 | Takahashi | 451/36 |
| 6,158,445 A | 12/2000 | Olesen et al. | 134/1.3 |
| 6,167,583 B1 | 1/2001 | Miyashita et al. | 15/77 |
| 6,228,563 B1 | 5/2001 | Starove et al. | 430/327 |
| 6,267,125 B1 | 7/2001 | Bergman et al. | 134/102.1 |
| 6,270,584 B1 | 8/2001 | Ferrell et al. | 134/26 |
| 6,272,712 B1 | 8/2001 | Gockel et al. | 15/77 |
| 6,276,459 B1 | 8/2001 | Herrick et al. | 169/14 |
| 6,286,231 B1 | 9/2001 | Bergman et al. | 34/410 |
| 6,290,780 B1 | 9/2001 | Ravkin | 134/6 |
| 6,296,715 B1 | 10/2001 | Kittle | 134/2 |
| 6,319,801 B1 | 11/2001 | Wake et al. | 438/585 |
| 6,352,082 B1 | 3/2002 | Mohindra et al. | 134/25.4 |
| 6,371,667 B1 * | 4/2002 | Kitano et al. | 396/611 |
| 6,386,956 B1 | 5/2002 | Sato et al. | 451/57 |
| 6,398,975 B1 | 6/2002 | Mertens et al. | 216/92 |
| 6,401,734 B1 | 6/2002 | Morita et al. | 134/153 |
| 6,423,148 B1 | 7/2002 | Aoki | 134/3 |
| 6,439,247 B1 | 8/2002 | Kittle | 134/102.1 |
| 6,457,199 B1 | 10/2002 | Frost et al. | 15/77 |
| 6,491,043 B2 | 12/2002 | Mohindra et al. | 134/25.4 |
| 6,491,764 B2 | 12/2002 | Mertens et al. | 134/36 |
| 6,493,902 B2 | 12/2002 | Lin | 15/302 |
| 6,508,882 B1 * | 1/2003 | Zeiffer et al. | 118/684 |
| 6,513,538 B2 | 2/2003 | Chung et al. | 134/1.2 |
| 6,514,921 B1 | 2/2003 | Kakizawa | 510/175 |
| 6,527,870 B2 | 3/2003 | Gotikis | 134/6 |
| 6,532,976 B1 | 3/2003 | Huh et al. | 134/111 |
| 6,537,915 B2 | 3/2003 | Moore et al. | 438/692 |
| 6,550,158 B2 * | 4/2003 | Doley et al. | 34/451 |
| 6,562,726 B1 | 5/2003 | Torek et al. | 438/745 |
| 6,576,066 B1 | 6/2003 | Namatsu | 134/30 |
| 6,585,875 B1 * | 7/2003 | Ryabkov | 205/87 |
| 6,594,847 B1 | 7/2003 | Krusell et al. | 15/102 |
| 6,616,772 B2 | 9/2003 | de Larios et al. | 134/21 |
| 6,733,596 B1 | 5/2004 | Mikhaylichenko et al. | 134/6 |
| 6,787,473 B2 | 9/2004 | Andreas | 438/692 |
| 6,797,071 B2 | 9/2004 | Kittle | 134/11 |
| 6,802,911 B2 | 10/2004 | Lee et al. | 134/28 |
| 6,846,380 B2 | 1/2005 | Dickinson et al. | 156/354.31 |
| 6,851,435 B2 | 2/2005 | Mertens et al. | 134/99.1 |
| 6,874,516 B2 | 4/2005 | Matsuno et al. | 134/148 |
| 6,896,826 B2 | 5/2005 | Wojtczak et al. | 252/79.1 |
| 6,927,176 B2 | 8/2005 | Verhaverbeke et al. | 438/745 |
| 6,946,396 B2 | 9/2005 | Miyazawa et al. | 438/689 |
| 6,951,042 B1 | 10/2005 | Mikhaylichenko et al. | 15/77 |
| 7,122,126 B1 | 10/2006 | Fuentes | 216/689 |
| 7,129,091 B2 * | 10/2006 | Ismagilov et al. | 436/34 |
| 2002/0072482 A1 | 6/2002 | Sachdev et al. | 510/175 |
| 2002/0094684 A1 | 7/2002 | Hirasaki et al. | 438/689 |
| 2002/0121290 A1 | 9/2002 | Tang et al. | 134/6 |
| 2002/0185164 A1 | 12/2002 | Tetsuka et al. | 134/148 |
| 2002/0195121 A1 | 12/2002 | Kittle | 134/3 |
| 2003/0075204 A1 | 4/2003 | de Larios et al. | 134/21 |
| 2003/0148903 A1 | 8/2003 | Bargaje et al. | 510/130 |
| 2003/0171239 A1 | 9/2003 | Patel et al. | 510/406 |
| 2003/0226577 A1 | 12/2003 | Orll et al. | 134/1.3 |
| 2004/0002430 A1 | 1/2004 | Verhaverbeke | 510/175 |
| 2004/0053808 A1 | 3/2004 | Raehse et al. | 510/447 |
| 2004/0134515 A1 | 7/2004 | Castrucci | 134/2 |
| 2004/0159335 A1 | 8/2004 | Montierth et al. | 134/10 |
| 2004/0163681 A1 | 8/2004 | Verhaverbeke | 134/28 |
| 2004/0261823 A1 | 12/2004 | de Larios | 134/31 |
| 2005/0045209 A1 | 3/2005 | Tan | 134/18 |
| 2005/0132515 A1 | 6/2005 | Boyd et al. | 15/77 |
| 2005/0133060 A1 | 6/2005 | de Larios et al. | 134/1.3 |
| 2005/0133061 A1 | 6/2005 | de Larios et al. | 134/6 |
| 2005/0159322 A1 | 7/2005 | Min et al. | 510/175 |
| 2005/0176606 A1 | 8/2005 | Konno et al. | 510/175 |
| 2005/0183740 A1 | 8/2005 | Fulton et al. | 134/3 |
| 2006/0201267 A1 | 9/2006 | Liu | 74/89.2 |
| 2006/0283486 A1 | 12/2006 | de Larios et al. | 134/34 |
| 2006/0285930 A1 | 12/2006 | de Larios et al. | 406/197 |
| 2007/0000518 A1 | 1/2007 | Korolik et al. | |

FOREIGN PATENT DOCUMENTS

| | | |
|---|---|---|
| EP | 0827188 | 3/1998 |
| EP | 0905746 | 3/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11 334874 | 12/1999 |
| JP | 11-350169 | 12/1999 |
| JP | 2001-064688 | 3/2001 |
| JP | 2002-66475 | 3/2002 |
| JP | 2002-280330 | 9/2002 |
| JP | 2002-309638 | 10/2002 |
| JP | 2003-282513 | 10/2003 |
| JP | 2005-194294 | 7/2005 |

| WO | WO-99/16109 | 4/1999 |
| WO | WO-00/33980 | 6/2000 |
| WO | WO-00/59006 | 10/2000 |
| WO | WO 01/12384 A2 | 2/2001 |
| WO | WO-02/101795 | 12/2002 |
| WO | WO-2005/006424 | 1/2005 |
| WO | WO 2005/064647 | 7/2005 |

OTHER PUBLICATIONS

Kittle, et al.; "Semiconductor Wafer Cleaning and Drying Using a Foam Medium"; <hhttp://www.aquafoam.com/papers;SCI0202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Advanced Wafer-Cleaning Evolution"; <http://www.aquafoam.com/papers/SCI0202.pdf>; Semiconductor International, 25, #2; Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Colloge, Dublin; 1999.

Kittle, et al.; "Photoresist Removal Using Aqueous Foam"; Internet; http://www.aquafoam.com/papers/SCCPresentation.pdf.

Kittle, et al.; "Aqueous Foam Drying and Cleaning of Semiconductor Wafers"; Internet; http://www.aquafoam.com/papers/SCCPresentation.pdf.

Kittle, et al.; "Foam Wafer Cleaning—Experimental Proof of Concept"; Internet; http://www.aquafoam.com/paper/Removalall.pdf.

Kittle, et al.; "Particulate Removal Using a Foam Medium"; Internet; http://www.aquafoam.com/paper/particulate.pdf.

Kittle, et al. "Removing Particles with a Foam Medium" Internet http://www.aquafoam.com/paper/A2C2foamedium.pdf.

Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.

Lide; "Air Composition"; CRC handbook of Chemistry and Physics; 1997.

U.S. Appl. No. 11/639,752, filed Dec. 15, 2006, Boyd et al.

U.S. Appl. No. 11/743,283, filed May 2, 2007, Freer et al.

* cited by examiner

METHOD AND APPARATUS FOR TRANSPORTING A SUBSTRATE USING NON-NEWTONIAN FLUID

CROSS REFERENCE TO RELATED APPLICATIONS

This application is related to U.S. patent application Ser. No. 11/153,957, filed on Jun. 15, 2005, and entitled "Method and Apparatus for Cleaning a Substrate Using Non-Newtonian Fluids," the disclosure of this application is incorporated herein by reference in their entirety for all purposes.

BACKGROUND

A substrate, such as a semiconductor wafer, can be moved from one location to another location by a variety of methods. For example, mechanical rollers are typically used in semiconductor manufacturing systems to move the substrate within the system. Specifically, a substrate may be placed between rollers such that the tapered surfaces of the rollers catch the edges of the substrate. To move the substrate, the rollers rotate to push the substrate towards a direction of the rotation. The problem with rollers, and other mechanical devices, is that the mechanisms associated with the rollers can be complicated. Furthermore, rollers must make contact with the substrate to move the substrate. Such contact can exert considerable stress on the substrate, which may lead to the degradation of the substrate.

Water also has been used to move a substrate. For example, the substrate can be placed in a flow of water to move the substrate in a direction of the flow. The problem with using water to transport the substrate is that the substrate can sink and stick to a bottom surface, thereby impeding transport of the substrate. When the substrate is stuck to a surface, the substrate cannot easily be dislodged. The substrate sinks to the bottom because water cannot support the substrate. Accordingly, the use of water to transport the substrate can be unreliable and the substrate is prone to being stuck at the bottom.

In view of the foregoing, there is a need to provide a simpler and more reliable method and apparatus to transport the substrate.

SUMMARY

Broadly speaking, the present invention fills these needs by providing methods, apparatuses, and systems for transporting a substrate. It should be appreciated that the present invention can be implemented in numerous ways, including as a method, a system, or a device. Several inventive embodiments of the present invention are described below.

In accordance with a first aspect of the present invention, an apparatus is provided that includes a chamber with a cavity in a form of a conduit. The conduit is configured to convey a non-Newtonian fluid to enable transport of a substrate through the conduit.

In accordance with a second aspect of the present invention, a system for transporting a substrate is provided. The system includes a chamber that has an input end, an output end, and an input port in a wall of the chamber. The input end defines a first opening capable of receiving the substrate and the output end defines a second opening. The input port is proximate to the first opening and configured to port a non-Newtonian fluid into the chamber. The system additionally includes a non-Newtonian fluid applicator coupled to the input port. The non-Newtonian fluid applicator is configured to port the non-Newtonian fluid through the input port into the chamber to enable a flow of the non-Newtonian fluid towards the second opening, whereby the flow is capable of moving the substrate from the first opening to the second opening.

In accordance with a third aspect of the present invention, a method for transporting a substrate is provided. In this method, a non-Newtonian fluid is provided and the substrate is suspended in the non-Newtonian fluid. The substrate can be suspended because the non-Newtonian fluid is capable of supporting the substrate. Thereafter, a supply force is applied on the non-Newtonian fluid to cause the non-Newtonian fluid to flow, whereby the flow is capable of moving the substrate along a direction of the flow.

In accordance with a fourth aspect of the present invention, a method for transporting a substrate is provided. In this method, a chamber in a form of a conduit is filled with a non-Newtonian fluid. The chamber has an input end and an output end. The substrate is introduced into the chamber at the input end such that the substrate is suspended in the non-Newtonian fluid. Additional non-Newtonian fluids are forced through the chamber such that a flow of the non-Newtonian fluid moves over surfaces of the substrate and the non-Newtonian fluid exits at the output end.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for methods, apparatuses, and systems for transporting a substrate. It will be obvious, however, to one skilled in the art, that the present invention may be practiced without some or all of these specific details. In other instances, well known process operations have not been described in detail in order not to unnecessarily obscure the present invention.

The embodiments described herein provide methods, apparatuses, and systems for transporting a substrate using a non-Newtonian fluid. Essentially, the substrate is transported by placing the substrate in a flow of the non-Newtonian fluid. The flow of the non-Newtonian fluid moves the substrate along a direction of the flow. As will be explained in more detail below, in one embodiment, an apparatus for transporting the substrate includes a chamber that has a cavity in a form of a conduit. The conduit can convey the non-Newtonian fluid to enable transport of the substrate through the conduit.

Figure 1:
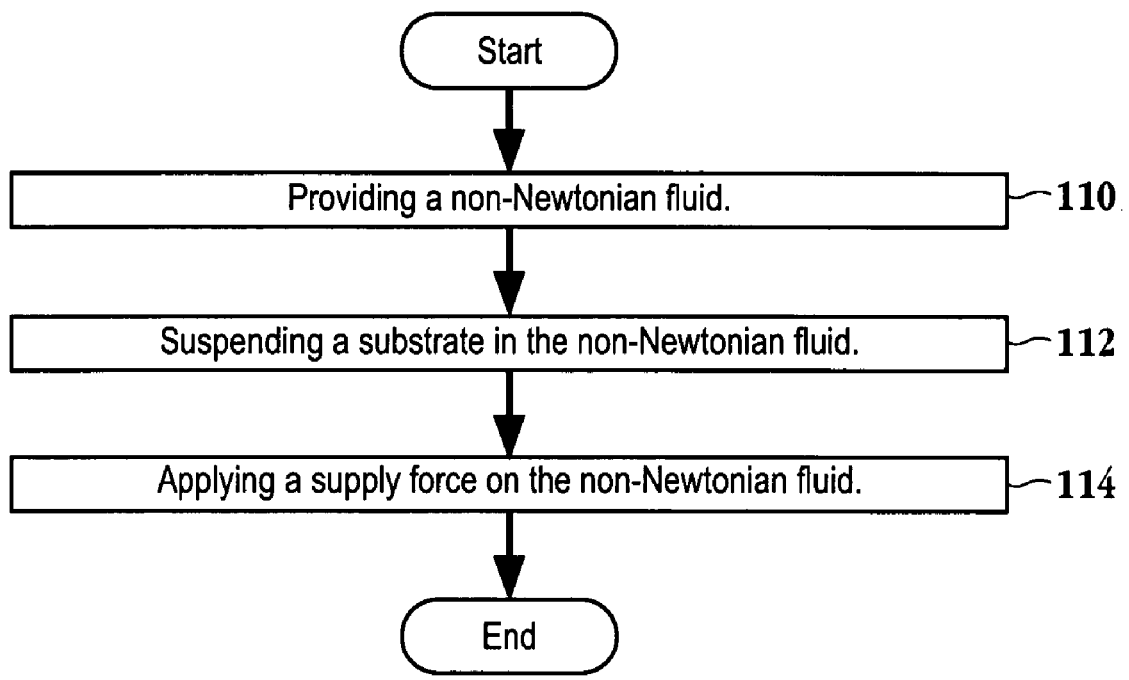
FIG. 1 is a flowchart diagram of a high level overview of a method for transporting a substrate, in accordance with one embodiment of the present invention.

FIG. 1 is a flowchart diagram of a high level overview of a method for transporting a substrate, in accordance with one embodiment of the present invention. As shown in FIG. 1, a non-Newtonian fluid is first provided in operation 110. The non-Newtonian fluid is a fluid in which the viscosity changes with an applied shear force. An example of a non-Newtonian fluid is a soft condensed matter which occupies a middle ground between the extremes of a solid and a liquid. The soft condensed matter is easily deformable by external stresses and examples of the soft condensed matter include emulsions, colloids, foam, etc. It should be appreciated that an emulsion is a mixture of immiscible liquids such as, for example, toothpaste, mayonnaise, oil in water, etc. A colloid is polymers dispersed in water, and gelatin is an example of a colloid. Foam is gas bubbles defined in a liquid matrix, and shaving cream is an example of a foam.

After the non-Newtonian fluid is provided, a substrate is suspended in the non-Newtonian fluid in operation 112. In other words, the substrate is immersed in the non-Newtonian fluid. The non-Newtonian fluid can support the substrate almost indefinitely, even without flow, because the non-Newtonian fluid is characterized by a yield point below which the non-Newtonian fluid does not flow. The weight of the substrate is sufficiently small such that the substrate resting on the non-Newtonian fluid does not exceed the yield point of the non-Newtonian fluid. Accordingly, the non-Newtonian fluid can support the substrate.

A substrate is any suitable base material. In one exemplary embodiment, the substrate is a semiconductor wafer, which is a thin slice of semiconductor material, such as a silicon crystal, upon which microcircuits are constructed by diffusion and deposition of various materials. In another exemplary embodiment, the substrate is a hard disk platter, which is composed of a round, rigid plate with a magnetic media coating.

Still referring to FIG. 1, after the substrate is suspended in the non-Newtonian fluid, a supply force is applied on the non-Newtonian fluid in operation 114 to cause the non-Newtonian fluid to flow. As will be explained in more detail below, since the substrate is suspended in the non-Newtonian fluid, the flow of the non-Newtonian fluid exerts a force on the substrate and moves the substrate along a direction of the flow. As a result, a flow of the non-Newtonian fluid can transport the substrate.

Figure 2A:
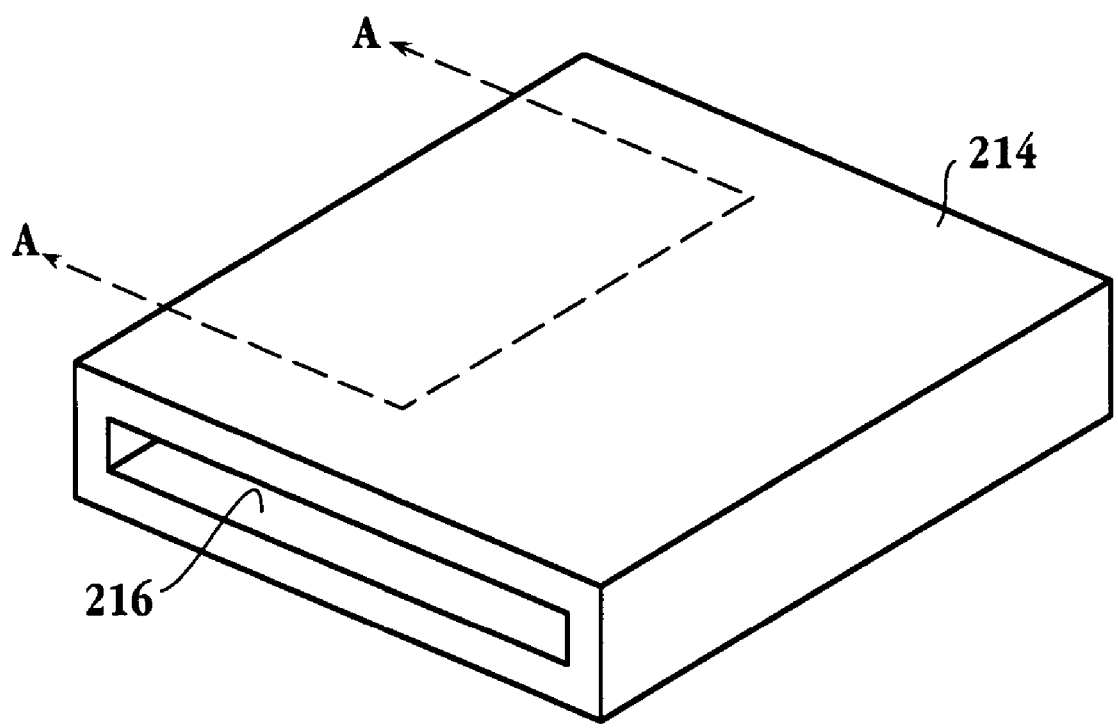
FIG. 2A is a simplified perspective view of an apparatus for transporting a substrate along a horizontal direction, in accordance with one embodiment of the present invention.

FIG. 2A is a simplified perspective view of an apparatus for transporting a substrate along a horizontal direction, in accordance with one embodiment of the present invention. Apparatus 214 includes chamber 216 that has a cavity in a form of a conduit. As will be explained in more detail below, the conduit is configured to convey a non-Newtonian fluid to enable transport of a substrate through the conduit. FIG. 2A shows that the cavity has a rectangular shape. However, it should be appreciated that the cavity may be defined by any suitable shape dimensioned to accommodate and transport the substrate. For example, in another embodiment, the cavity can have a cylindrical shape.

Figure 2B:
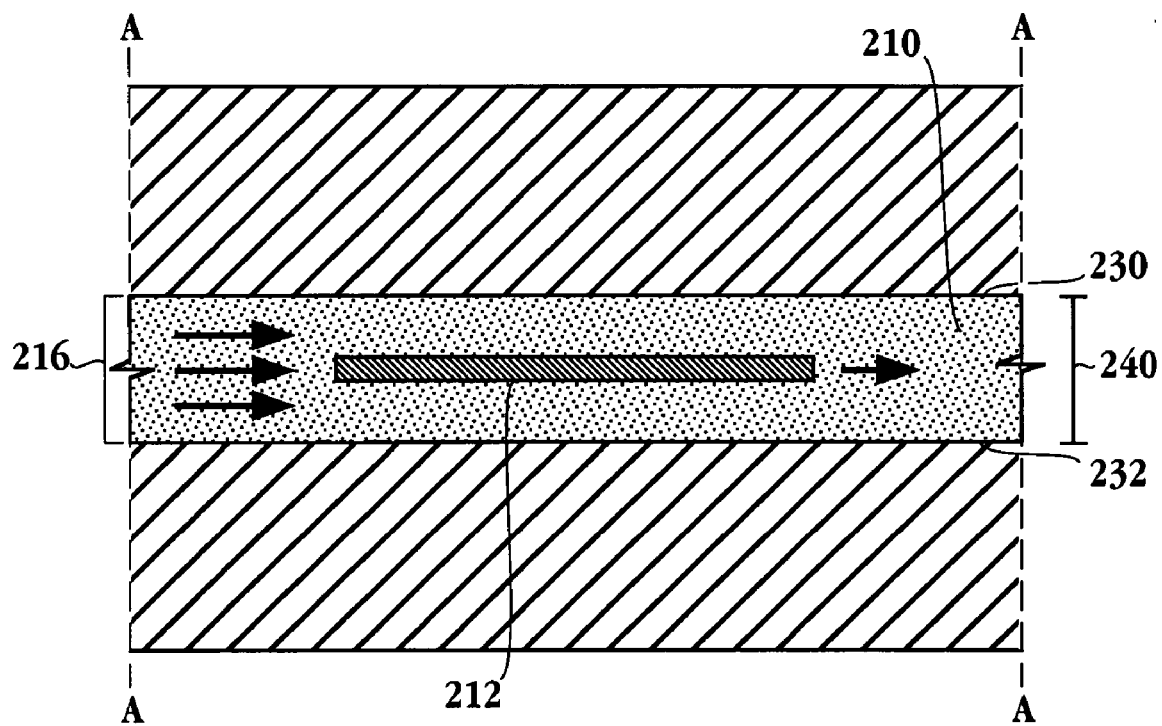
FIG. 2B is a sectional, side view of a transport portion of the apparatus shown in FIG. 2A.

FIG. 2B is a sectional, side view of a transport portion of the apparatus shown in FIG. 2A along cutting plane line A-A. As shown in FIG. 2B, chamber 216 of apparatus 214 is filled with non-Newtonian fluid 210. Substrate 212 is suspended within non-Newtonian fluid 210. A transport portion of chamber 216 is defined by a channel conduit dimensioned to transport substrate 212. For example, FIG. 2B shows a partially enclosed conduit defining the transport portion. In particular, when viewed from the side, the partially enclosed conduit is defined by top planar surface 230 and bottom planar surface 232 that is oriented relative to the top planar surface such as to enclose substrate 212 between the top planar surface and the bottom planar surface. Height 240 of conduit, as defined by a distance between top planar surface 230 and bottom planar surface 232, can have any suitable dimensions greater than a thickness of substrate 212. For example, if thickness of substrate 212 is one millimeter, then height 240 can be four millimeters.

To transport substrate 212, a supply force is applied on non-Newtonian fluid 210 to cause the non-Newtonian fluid to flow. The supply force may be generated by any suitable methods. For example, supply force may be generated by pumping additional non-Newtonian fluid 210 into the chamber. The flow of non-Newtonian fluid 210 is capable of moving substrate 212 along a direction of the flow. FIG. 2B shows the direction of flow from left to right and substantially parallel to surfaces of substrate 212. The flow of non-Newtonian fluid 210 moves over surfaces of substrate 212 and exerts a force parallel to surfaces of the substrate to move the substrate horizontally from left to right at or close to a velocity of the flow.

Figure 3A:
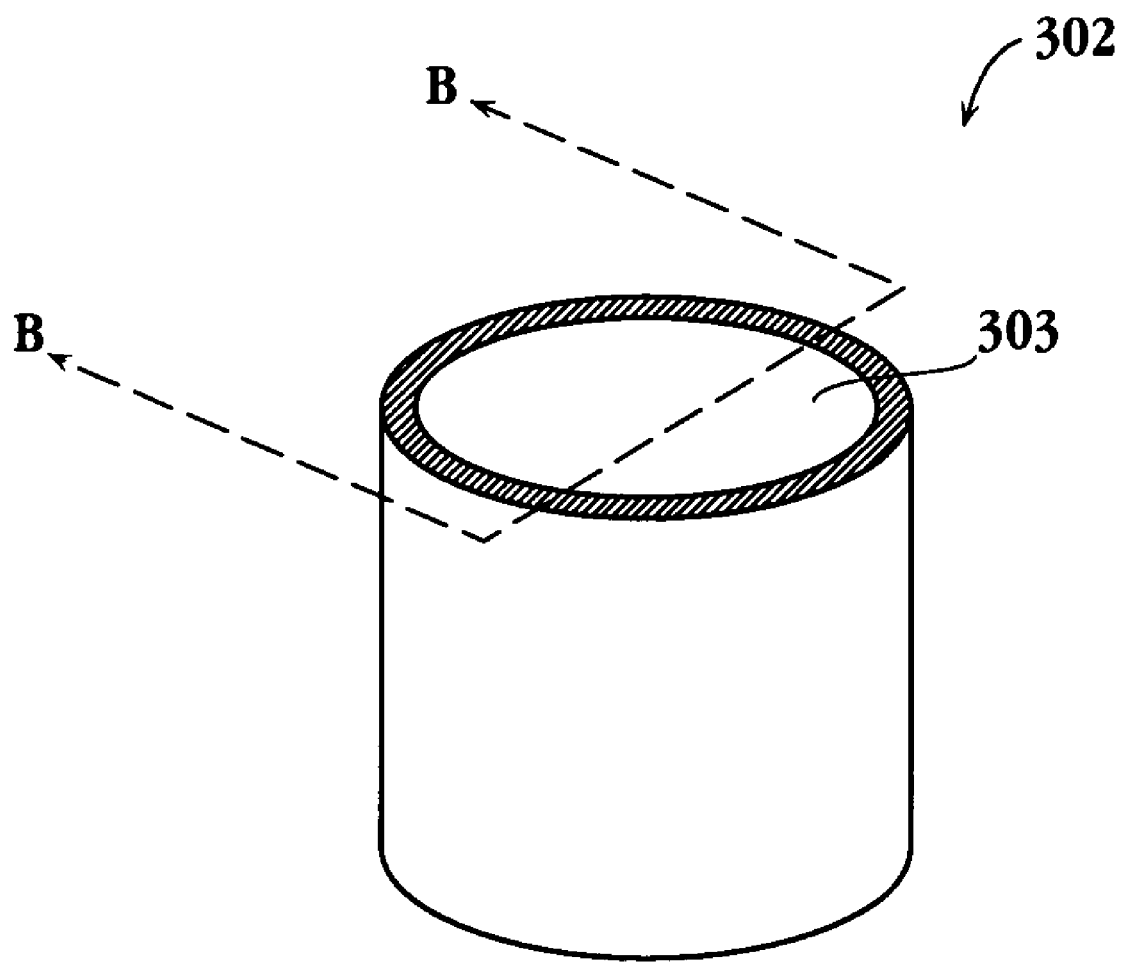
FIG. 3A is a simplified perspective view of an apparatus for transporting a substrate along a vertical direction, in accordance with one embodiment of the present invention.

FIG. 3A is a simplified perspective view of an apparatus for transporting a substrate along a vertical direction, in accordance with one embodiment of the present invention. Apparatus 302 includes chamber 303 that has a cavity in a form of a cylindrical conduit. The conduit is configured to convey a non-Newtonian fluid to enable transport of a substrate through the conduit.

Figure 3B:
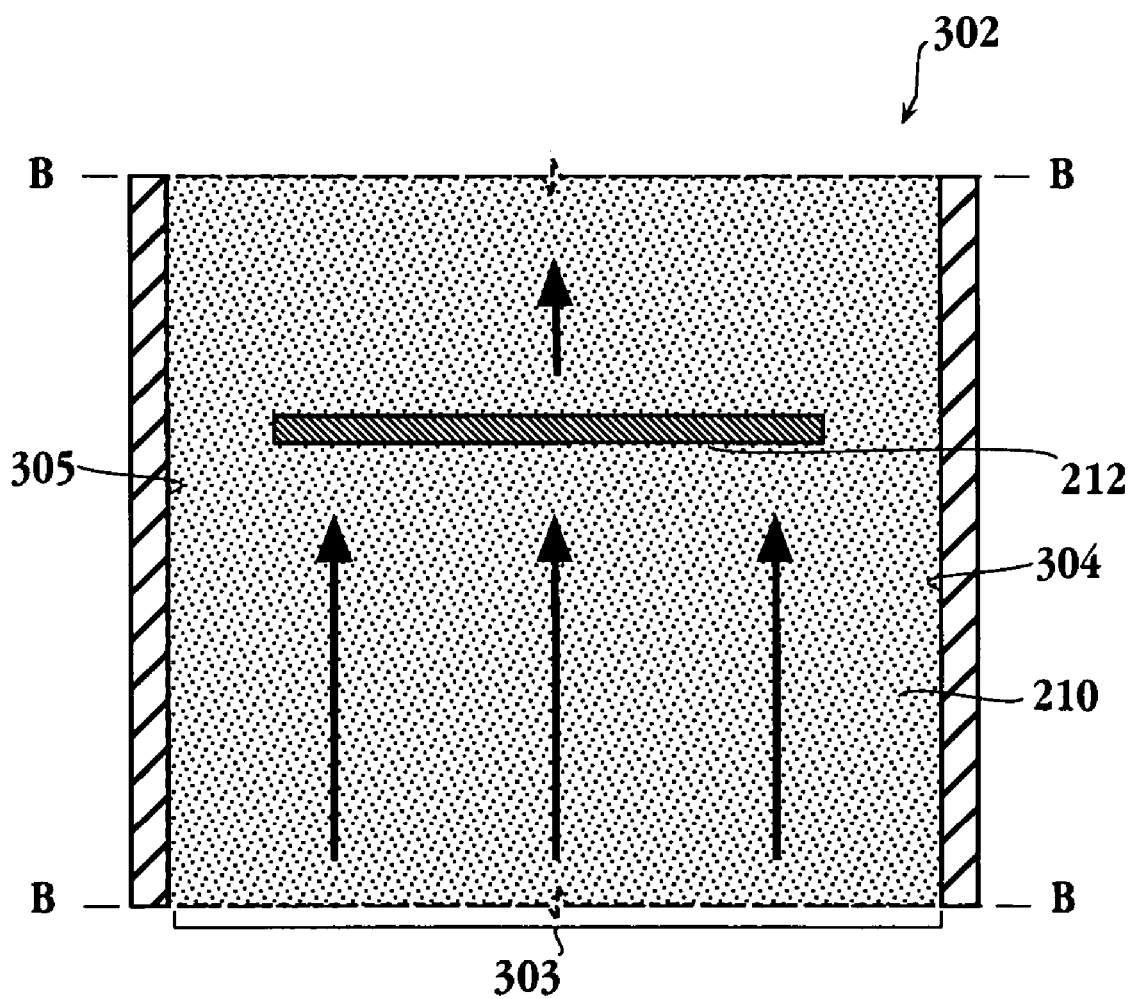
FIG. 3B is a sectional, side view of a transport portion of the apparatus shown in FIG. 3A.

FIG. 3B is a sectional, side view of a transport portion of the apparatus shown in FIG. 3A along cutting plane line B-B. As shown in FIG. 3B, chamber 303 of apparatus 302 is filled with non-Newtonian fluid 210. Substrate 212 is suspended within non-Newtonian fluid 210. The transport portion of chamber 303 is defined by a channel conduit dimensioned to transport substrate 212 vertically. When viewed from the side, the conduit is defined by left vertical surface 305 and right vertical surface 304. Left vertical surface 305 is oriented relative to right vertical surface 304 such as to enclose substrate 212 between the left vertical surface and the right vertical surface. In this embodiment, substrate 212 is oriented substantially perpendicular to left vertical surface 305 and right vertical surface 304.

To transport substrate 212 vertically, a supply force is applied on non-Newtonian fluid 210 to cause the non-Newtonian fluid to flow. As show in FIG. 3B, non-Newtonian fluid 210 flows vertically from bottom to top. The direction of the flow of non-Newtonian fluid 210 is substantially perpendicular to surfaces of substrate 212. Accordingly, the flow exerts forces that are substantially perpendicular to a bottom surface of substrate 212 to move the substrate vertically upwards.

Figure 4A:
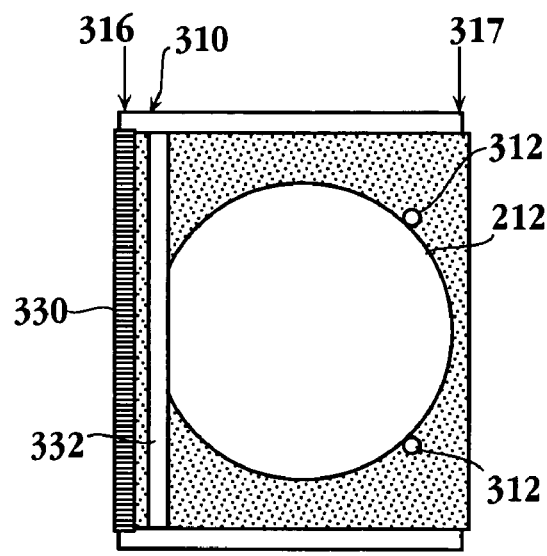
FIG. 4 are various views of another apparatus for transporting a substrate, in accordance with one embodiment of the present invention.
Figure 4B:
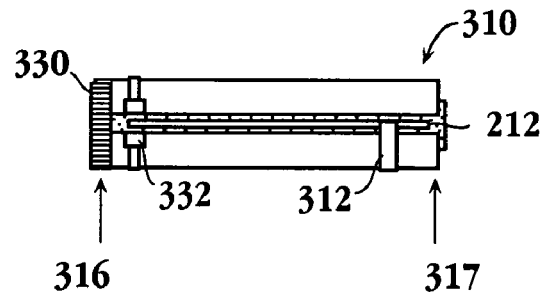
Figure 4C:
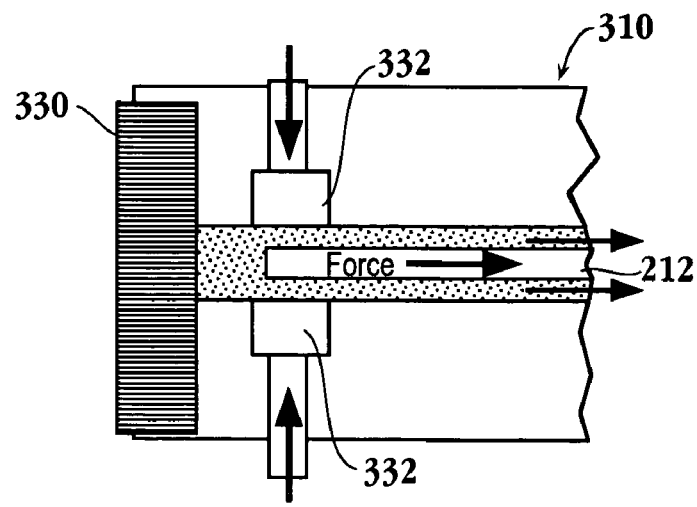

FIG. 4 are various views of another apparatus for transporting a substrate, in accordance with one embodiment of the present invention. FIG. 4 illustrates a top view, a side view, and an expanded side view of apparatus 310. Apparatus 310 includes a chamber, input ports 332, holding pins 312, and panel 330. The chamber has a cavity in a form of a rectangular conduit. The chamber has input end 316 and output end 317 that is located opposite to the input end. Input end 316 is defined by a first opening that is capable of receiving substrate 212. Output end 317 is defined by a second opening that is capable of outputting substrate 212. Additionally included is panel 330 proximate to the first opening at input end 316 that can be used to seal off the first opening.

Apparatus 310 also includes input ports 332 coupled to the walls of the chamber. Input ports 332 are configured to port the non-Newtonian fluid into the chamber. As shown in the top view of FIG. 4, in one embodiment, input ports 332 extend along a width of the chamber. However, it should be appreciated that input ports 332 can have any suitable shapes and sizes. A non-Newtonian applicator (not shown) can be coupled to input ports 332 to port non-Newtonian fluid into the chamber through the input ports. In the embodiment of FIG. 4, apparatus 310 includes two input ports 332 located proximately to input end 316. The side view shows that one of the input ports 332 is located at the top of the chamber and the other input port is located at the bottom. Input ports 332 are placed opposite to each other in order to create opposing flows of the non-Newtonian fluid from the top and bottom. The opposing flows assist in keeping substrate 212 suspended in the middle of the chamber by exerting forces on opposite surfaces of the substrate. However, depending on the desired direction of flow, apparatus 310 can include one input port or more than two input ports. Further, as will be described in more detail below, input ports 332 are located proximate to input end 316 because the desired direction of flow is from the input end to output end 317. Nonetheless, it should be appreciated that input ports 332 may be placed in any suitable location within the chamber to create different flow characteristics.

Still referring to FIG. 4, before substrate 212 is introduced into the chamber of apparatus 310, a non-Newtonian fluid applicator ports a non-Newtonian fluid into the chamber through input ports 332 to fill the chamber with the non-Newtonian fluid. After the chamber is filled with the non-Newtonian fluid, substrate 212 is introduced into the chamber though the first opening at input end 316. Substrate 212 is introduced such that the substrate is suspended in the non-Newtonian fluid. In other words, substrate 212 is placed in the chamber such that the substrate is not in contact with a surface of the chamber. The non-Newtonian fluid has the capability to support substrate 212 such that the substrate is suspended in the middle of the chamber. The opposing flows from input ports 332 also assist in keeping substrate 212 suspended in the middle of the chamber by exerting forces on opposite surfaces of the substrate.

After substrate 212 is introduced into the chamber, panel 330, which is proximate to the first opening at input end 316, closes to seal off the first opening. Since the non-Newtonian fluid cannot exit though the first opening at input end 316, the non-Newtonian fluid ported from input ports 332 flows from the input end towards output end 317 to exit at the second opening at the output end. The flow of the non-Newtonian fluid moves over surfaces of substrate 212 and exerts forces on the substrate in a direction of the flow. As a result, the flow moves substrate 212 towards output end 317.

Embodiments of apparatus 310 can include one or more holding pins 312 within the chamber. Holding pins 312 are used to receive an edge of substrate 212 to prevent the movement of the substrate. In the embodiment of FIG. 4, holding pins 312 are located proximate to output end 317 to prevent substrate 212 from moving through the second opening at the output end when the non-Newtonian fluid flows though the chamber. Holding pins 312 can hold substrate 212 while enabling the non-Newtonian fluid to flow through the conduit. To allow movement of substrate 212, holding pins 312 may be configured to release a hold of the substrate to allow the flow of the non-Newtonian fluid to move the substrate along the conduit and out of the second opening at output end 317. For example, in one embodiment, holding pins 312 can be lowered to allow movement of substrate 212.

Figure 5:
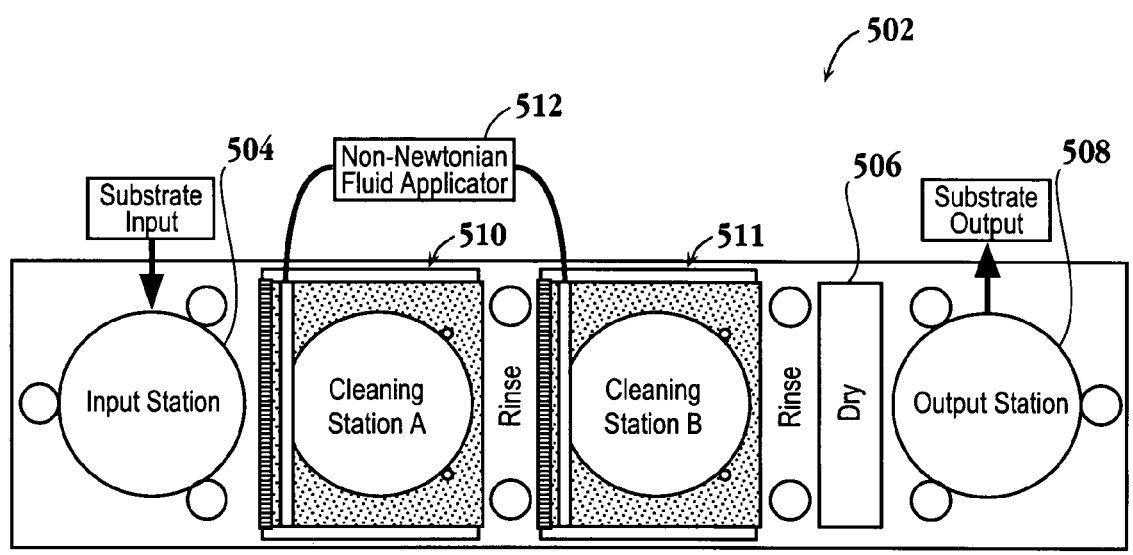
FIG. 5 is a block diagram of a semiconductor substrate cleaning system utilizing the apparatus shown in FIG. 4 to transport a substrate, in accordance with one embodiment of the present invention.

FIG. 5 is a block diagram of a semiconductor substrate cleaning system utilizing the apparatus shown in FIG. 4 to transport a substrate, in accordance with one embodiment of the present invention. Substrate cleaning system 502 is used in a semiconductor device manufacturing process to remove particles and trace metal contamination from a substrate. As shown in FIG. 5, substrate cleaning system 502 includes input station 504, cleaning station A 510, cleaning station B 511, drying station 506, non-Newtonian fluid applicator 512, and output station 508. Embodiments of substrate cleaning system 502 can incorporate the apparatus shown in FIG. 4 in cleaning station A 510 and cleaning station B 511 to transport the substrate. It should be appreciated that cleaning station A 510 and cleaning station B 511 can include any suitable cleaning device configured to clean a substrate. For example, cleaning station A 510 and cleaning station B 511 can use foam to clean the substrate. For more information on the use of foam to clean a substrate, reference may be made to U.S. patent application Ser. No. 11/153,957, filed on Jun. 15, 2005 and entitled "Method and Apparatus for Cleaning a Substrate Using Non-Newtonian Fluids," which is herein incorporated by reference.

An exemplary operation to clean a substrate would start with a substrate inputted into input station 504. Non-Newtonian fluid applicator 512 that is coupled to cleaning station A 510 and cleaning station B 511 provides a non-Newtonian fluid and supply force to port the non-Newtonian fluid into a chamber of cleaning station A 510. After the chamber of cleaning station A 510 is filled with the non-Newtonian fluid, rollers in input chamber 504 push the substrate into the chamber of the cleaning station A to stop at holding pins located within the chamber. When the substrate is fully inserted in cleaning station A 510, a panel of the cleaning station A closes to seal off an opening of the cleaning station. Using a suitable cleaning method, cleaning station A 510 then cleans the substrate. After the substrate is cleaned, the holding pins are lowered to allow the substrate to move with the flow of the non-Newtonian fluid out of cleaning station A 510.

After cleaning station A 510 cleans the substrate, the substrate is rinsed and introduced into cleaning station B 511 for a second cleaning. Cleaning station B 511 can use the same cleaning process as cleaning station A 510 or use a different cleaning process. After cleaning station B 511 cleans the substrate, the substrate is transported out of the cleaning station B using a flow of the non-Newtonian fluid, and the substrate is rinsed and then dried at drying station 506. Thereafter, rollers pushes the cleaned, dried substrate out to output station 508, where the substrate is outputted from substrate cleaning system 502.

In summary, the above described embodiments provide methods, apparatuses, and systems for transporting a substrate. Basically, a flow of non-Newtonian fluid is used to move the substrate from one location to another location. Unlike water, the non-Newtonian fluid can support the substrate. As a result, the substrate will not sink and stick to the bottom when placed in the non-Newtonian fluid. Furthermore, since the non-Newtonian fluid can support the substrate, no mechanical mechanisms make contact with the substrate during transport. The non-Newtonian fluid does not exert any notable stress on the substrate. As a result, unlike the use of rollers, the substrate can be transported by the non-Newtonian fluid without significant stress on the substrate.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A system for transporting a substrate, comprising:
 a chamber having an input end defining a first opening through which the substrate is introduced, and an output end opposing the input end, the first opening having a panel that opens and closes access to the chamber through the first opening the output end defining a second opening, the chamber having a top wall and a bottom wall, wherein the top wall and the bottom wall both have opposing inlets defined therethrough, wherein the inlets are proximate to the first opening; and
 a non-Newtonian fluid disposed within the chamber prior to introduction of the substrate, the non-Newtonian fluid introduced through the inlets while the panel closes access to the chamber through the first opening, whereby the non-Newtonian fluid supports the substrate in the chamber and a flow of the non-Newtonian fluid through the inlets transports the substrate from a region proximate to the first opening toward the second opening while the panel is closed.

2. The system of claim 1, wherein a transport portion of the chamber where movement of the substrate occurs is defined by a channel conduit dimensioned to transport the substrate.

3. The system of claim 1, wherein a transport portion of the chamber where movement of the substrate occurs is defined by a partially enclosed conduit.

4. The system of claim 3, wherein the partially enclosed conduit includes,
 a first planar surface; and
 a second planar surface oriented relative to the first planar surface configured to enclose the substrate between the first and second planar surfaces.

5. The system of claim 1, further comprising:
 a holding pin within the chamber that is proximate to the second opening, the holding pin being configured to receive an edge of the substrate to prevent the moving of the substrate through the second opening when the non-Newtonian fluid flows through the chamber.

6. The system of claim 5, wherein the holding pin is capable of being lowered to enable the substrate to move out of the chamber through the second opening.

7. The system of claim 1, wherein a direction of the flow of the non-Newtonian fluid is substantially perpendicular to a surface of the substrate.

8. The system of claim 1, wherein a direction of the flow of the non-Newtonian fluid is substantially parallel to a surface of the substrate.

9. The system of claim 1, wherein the non-Newtonian fluid is defined as one or more of a foam, a colloid, and an emulsion.

10. The system of claim 1, wherein the inlets are channels extending across a length of the corresponding top wall and bottom wall.

* * * * *